United States Patent
Stanzl

[19]

[11] Patent Number: 6,064,483
[45] Date of Patent: *May 16, 2000

[54] DEVICE FOR CHECKING THE POSITION THE COPLANARITY AND THE SEPARATION OF TERMINALS OF COMPONENTS

[75] Inventor: Harald Stanzl, Munich, Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 09/093,345

[22] Filed: Jun. 9, 1998

[30] Foreign Application Priority Data

Aug. 7, 1997 [DE] Germany ............... 197 34 228

[51] Int. Cl.⁷ ................................. G01N 21/00
[52] U.S. Cl. ............... 356/375; 356/398; 356/237.1
[58] Field of Search ................. 356/394, 237, 356/398, 375, 376; 382/145, 147, 87; 395/22

[56] References Cited

U.S. PATENT DOCUMENTS

| | | | |
|---|---|---|---|
| 4,028,728 | 6/1977 | Sharp | 356/394 |
| 4,739,175 | 4/1988 | Tamura | 250/561 |
| 5,162,866 | 11/1992 | Tomiya et al. | 356/398 |
| 5,208,463 | 5/1993 | Honma et al. | 356/394 |
| 5,212,390 | 5/1993 | LeBeau et al. | 356/376 |
| 5,440,391 | 8/1995 | Smeyers et al. | 356/375 |
| 5,751,910 | 5/1998 | Bryant et al. | 395/22 |

*Primary Examiner*—Hoa Q. Pham
*Attorney, Agent, or Firm*—Hill & Simpson

[57] ABSTRACT

A device for detecting the position, coplanarity and separation of terminals of printed circuit board components wherein the terminals are consecutively imaged on a topically resolving detector through the use of an illuminating light source, and wherein the direct reflections are suppressed by the use of a polarized light source and by the existence of an optical analyzer in the imaging beam path, resulting in only the diffused reflections being used for imaging to avoid overradiation of the detector.

7 Claims, 2 Drawing Sheets

FIG 4

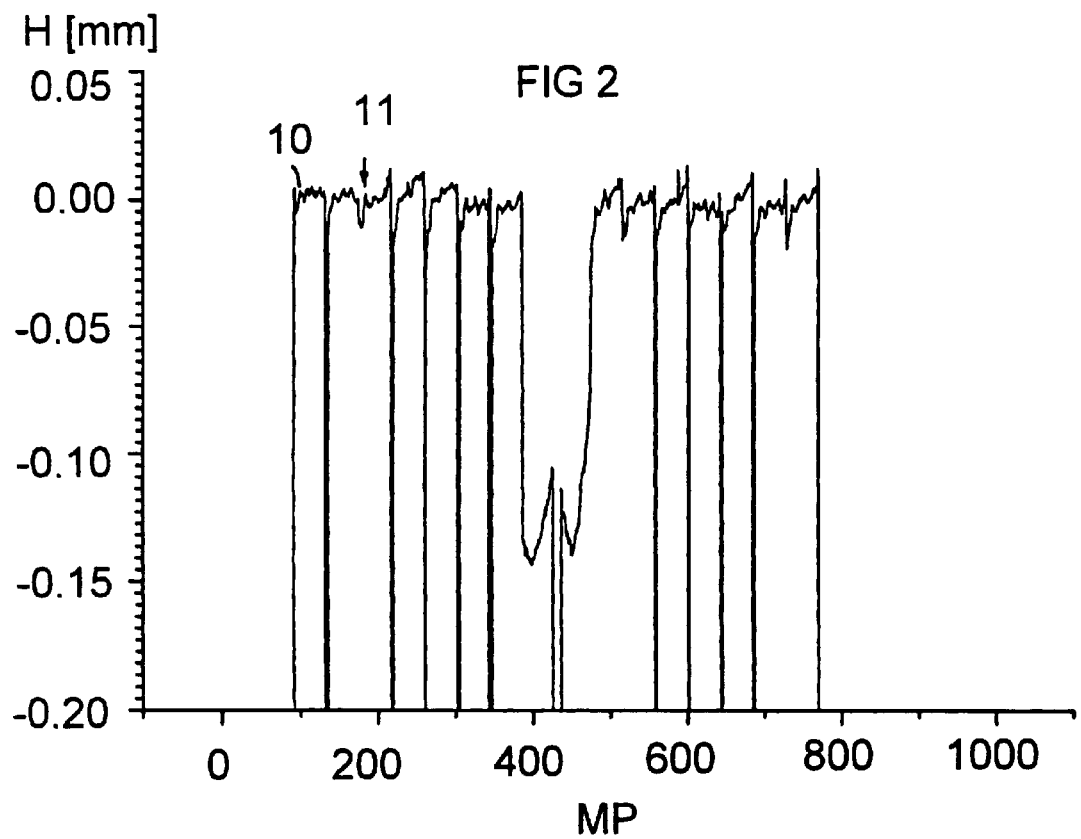
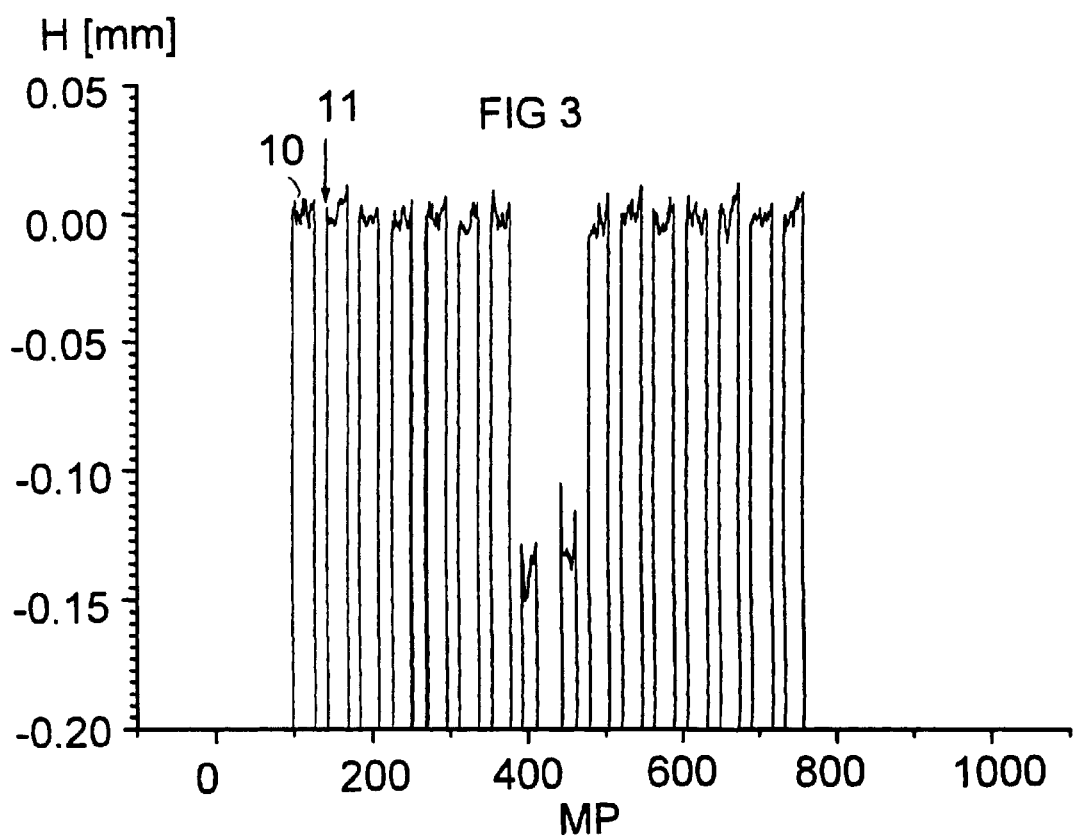

DEVICE FOR CHECKING THE POSITION THE COPLANARITY AND THE SEPARATION OF TERMINALS OF COMPONENTS

BACKGROUND OF THE INVENTION

1. Field of the Invention

The present invention relates, generally, to a device for detecting the position of terminals of components, and for testing the coplanarity and separation of the same. More specifically, the present invention relates to a device which can detect the position, the coplanarity and the separation of such terminals without overradiating the detector device used.

2. Description of the Prior Art

In the automatic insertion of printed circuit boards, or ceramic substrates, with SMD components (SMD =Surface Mounted Device), the individual components are first removed from a magazine or delivery means using an insertion head and then positioned in a prescribed position on the printed circuit board or ceramic substrate. Since the components have a positional tolerance of approximately 1 millimeter in the magazine or the pick-up position of a delivery device, yet require highly exact positioning on the printed circuit board or ceramic substrate, an automatic position detection and correction method is necessary. Furthermore, the separation and the coplanarity, i.e., the uniform height position of the terminals, must be checked, particularly with SMD components having a large number of poles. Such a check is also performed in the manufacture of the SMD components as part of quality control, for example.

Known methods for position detection and separation checking of the terminals of components typically include the steps of forming an image of the component, or pieces of the component, on a planar CCD camera and detecting both the position and separation of the terminals using digital image processing. However, direct reflections can cause overradiation of the CCD camera wherein resolution is reduced.

U.S. Pat. No. 5,440,391 teaches a triangulation method for measuring coplanarity wherein the height position of a terminal of an SMD component is determined through an illumination of the terminal with light from two directions and a subsequent detection of the two resulting shadows of the terminals with CCD cameras. In an image evaluation unit which is connected downstream to the cameras, the height position of the terminals is determined. Given an impermissible deviation of the coplanarity which would preclude the yielding of a contact by all terminals when the latter are placed on the printed circuit board, the faulty component can be identified and removed from the insertion process. Of course, this method is not suited to checking terminals which are not illuminated by light; e.g., terminals which are located under the component and are shaded from light as such.

A further method is known which uses the diffuse reflection of light at the terminals, instead of using the throwing of shadows, to determine the coplanarity and the separation of the terminals. The terminals are therein illuminated with vertically incident light and their images are formed on a topically resolving detector means through an optical imaging means. The imaging beam path therein forms an angle with the vertically incident light, wherein the angle is not equal to zero degrees, so that the height position of the terminals can be determined by triangulation. In this fashion, the influence of light beams reflected directly into the detector means may be decreased. A modified height position of the terminals therein affects a modified imaging location in the detector means, which location is recognized by an image evaluation means connected downstream. Through a scanning motion along the terminal rows of the component, it can be assured that all terminals are imaged. Because of the different surface nature of the terminals, besides the diffuse reflections, direct reflections of greater intensity reach the detector means causing it to be partially overradiated. Direct reflections occurring far from the actual center of radiation can also reduce the lateral resolution of the detector means. As a result of both effects, the terminal intervals for the separation test are no longer reliably detected.

SUMMARY OF THE INVENTION

It is therefore an object of the present invention to provide a device which detects position, coplanarity and separation of terminals of components wherein the device avoids the overdriving of the detection means.

The use of polarized light for illuminating the terminals and the introduction of an optical analyzer into the radiation path are constructively simple to realize. In the following, the term "optical analyzer" is to be understood as an optical component with polarization-dependent transparency, as is common in optics. Polarization filters, for example, are employed as optical analyzers. In contrast to polarizers, which are of essentially the same construction and which create polarized light from unpolarized light, optical analyzers are used to analyze light that is already polarized. Direct reflections have a fixed polarizing direction in contrast to diffuse reflections and can thus be suppressed through the introduction of an optical analyzer into the beam path. This prevents the overdriving of the detector means by direct reflection.

The use of a laser as the light source in the present invention is particularly advantageous since laser light is already linearly polarized; thus requiring no further constructive outlay for creating polarized light. Further, the rotatable arrangement of the preferred optical analyzer of the present invention enables the attenuation of the direct reflexes to be set in an advantageous fashion.

Accordingly, in an embodiment of the present invention, a device for checking the position, coplanarity and separation of terminals of printed circuit board components is provided which includes a light source for illuminating the terminals, wherein the light with which the terminals are illuminated is linearly polarized along a first light path and reflected off of the terminals along a second light path; a topically resolving detector on which images of the terminals are detected, the detector positioned along the second light path; an optical analyzer positioned between the terminals and the detector along the second light path; and an image evaluation unit connected downstream to the detector, the evaluation unit detecting a position of the terminals on the component being detected from the images.

In an embodiment, the device further includes a laser as the light source.

In an embodiment, the device further includes a polarizer positioned between the light source and the terminals along the first light path.

In an embodiment, the device further includes at least one light emitting diode as the light source.

In an embodiment, the detector further includes an arrangement of photo detectors in rows which are approximately perpendicular to the second light path wherein images of incorrectly aligned terminals and images of correctly aligned terminals are respectively received by different photo detectors.

In an embodiment, the device further includes a planar CCD camera as the detector.

In an embodiment, the optical analyzer may be rotated about an axis lying parallel to the second light path.

Additional features and advantages of the present invention are described in, and will be apparent from, the Detailed Description of the Preferred Embodiments and from the Drawings.

DESCRIPTION OF THE DRAWINGS

FIG. 2 shows a recording of the height position of sixteen terminals of a component without the use of an optical analyzer.

FIG. 3 shows a recording of the height position of sixteen terminals of a component with the use of an optical analyzer.

DETAILED DESCRIPTION OF THE PREFERRED EMBODIMENTS

Figure 1:
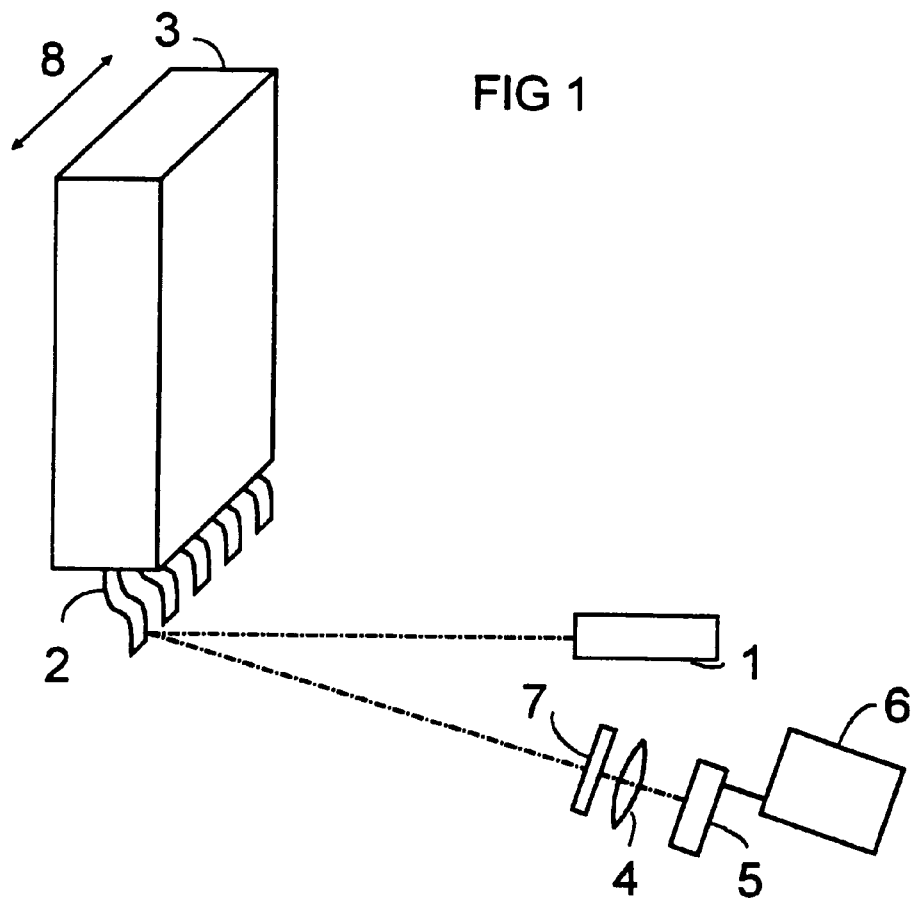
FIG. 1 is a schematic diagram of the device of the present invention having a laser light source.

FIG. 1 depicts how polarized light from a light source 1 illuminates with vertical incidence a terminal 2 of a component 3, and how the terminal 2 is imaged on a topically resolving detector 5 by an optical imaging means 4 (e.g., a positive lens). An arrangement of photodetectors in rows, for example, is suitable as the detector 5 wherein the arrangement is configured perpendicular to the imaging beam path so that the terminals 2 with different height positions are detected by different photodetectors. The imaging beam path is therein displaced at an angle of approximately 30° relative to the perpendicularly incident light, so that the overradiation by direct reflections is already decreased. An image evaluation unit 6 connected downstream of the detector 5 evaluates the position of the imaging, whereupon the height position of each terminal 2 is determined. In the beam path between the terminal 2 and the detector 5, a polarization filter is arranged as optical analyzer 7. This polarization filter is configured so that it is not transparent, or is barely transparent, for the light reflected directly by the terminal 2. The overdriving of the detector means 5, as exemplified in FIG. 2 as a measurement without the optical analyzers 7, is thereby avoided.

The sixteen terminals 2 of the component 3 were measured through scanning, in a direction 8 of the arrangement of the terminals 2, and simultaneously recording the position H of the imaging at 1000 measurement points. A position H=0 mm for example, means an optimal alignment. The detector 5 is therein overdriven by direct reflections so that not only the images 10 of the terminals but also the images 11 of the terminal intervals simulate a position H which corresponds to the position H of the images 10 of the terminals 2 according to their order of magnitude. However, the images 10 of the terminals 2 are subjected to a separation test. That is, a measurement of the intervening distances of the terminals 2 is not possible.

In contrast thereto, FIG. 3 depicts the result of a corresponding measurement with an optical analyzer 7 in the beam path between the terminals 2 and the detector 5. Through the suppression of direct reflections, the detector 5 is not overdriven. At the same time, diffuse reflections for the origination of imaging on the basis of the different polarizing directions reach the detector 5 through the optical analyzer 7 and are subsequently applied for evaluation. The images 10 of the terminals 2 are clearly separated from each other by the images 11 of the terminal intervals, so that a separation test is enabled. The faulty coplanarity of the eighth and ninth terminal (in the region of the measurement points 400 to 500) is also depicted more clearly in FIG. 3 than in FIG. 2, so that the coplanarity test is also simplified.

Lasers are particularly appropriate for use as the light source 1 since they emit light that is already linearly polarized. As such, an additional polarization filter need not be arranged as a polarizer in the beam path between the light source 1 and the terminal 2. Without the use of a laser, the polarized light can be otherwise created by a light-emitting diode and a polarizer. The optical analyzer 7 is therein borne so that it can be rotated about an axis parallel to the optical axis of the imaging so as to enable the setting of the optimal attenuation of the direct reflections.

Figure 4:
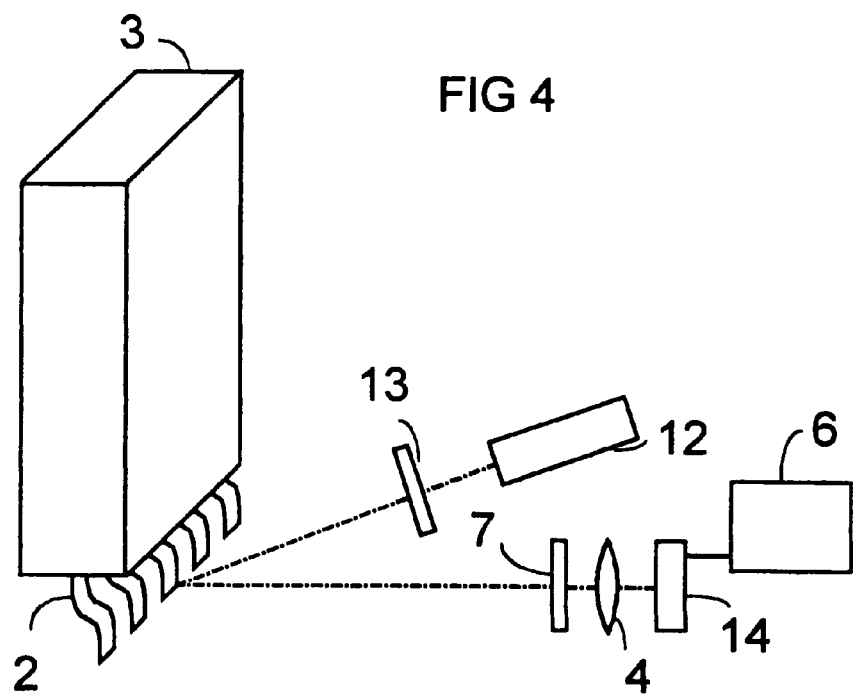
FIG. 4 is a schematic diagram of the device of the present invention having light-emitting diodes as a light source.

FIG. 4 depicts a device for position detection. With the aid of a light source of light-emitting diodes (LEDs) 12 whose emitted light is linearly polarized in the beam path between the light-emitting diodes 12 and the component 3 by a polarizer 13, the component 3, or at least a section of the component 3, is illuminated and imaged on a planar CCD camera 14 via an optical imaging means 4. An imaging evaluation unit 6 for evaluating the position detection is connected downstream to the CCD camera 14. An optical analyzer 7 is arranged in the imaging beam path to suppress direct reflections which would overdrive the CCD camera 14.

Although the present invention has been described with reference to specific embodiments, those of skill in the art will recognize that changes may be made thereto without departing from the spirit and scope of the invention as set forth in the hereafter appended claims.

I claim as my invention:

1. A device for checking the position, coplanarity and separation of terminals of components, comprising:

a light source for illuminating the terminals successively, wherein the light with which the terminals are illuminated is linearly polarized along a first light path and directly reflected off of the terminals along a second light path;

a topically resolving detector on which images of the terminals are detected and applied for evaluation, the detector positioned along the second light path;

an optical analyzer for receiving the images of the terminals applied for evaluation, the optical analyzer positioned between the terminals and the detector along the second light path and suppressing the directly reflected light wherein only diffused reflections reach the detector; and an image evaluation unit connected downstream to the detector, the evaluation unit detecting a position of the terminals on the component being detected from the images.

2. A device as claimed in claim 1, further comprising:

a laser as the light source.

3. A device as claimed in claim 1, further comprising:

a polarizer positioned between the light source and the terminals along the first light path.

4. A device as claimed in claim 3, further comprising:

at least one light emitting diode as the light source.

5. A device as claimed in claim 1, wherein the detector further comprises an arrangement of photo detectors in rows which are approximately perpendicular to the second light path such that images of incorrectly aligned terminals and images of correctly aligned terminals are respectively received by different photo detectors.

6. A device as claimed in claim 1, further comprising:

a planar CCD camera as the detector.

7. A device as claimed in claim 1, wherein the optical analyzer may be rotated about an axis lying parallel to the second light path.

* * * * *